(12) United States Patent
Fu

(10) Patent No.: US 10,986,747 B2
(45) Date of Patent: Apr. 20, 2021

(54) FIXING ASSEMBLY, CASING ASSEMBLY, AND ELECTRONIC DEVICE

(71) Applicant: Wistron Corp., New Taipei (TW)

(72) Inventor: Zhao-Ping Fu, New Taipei (TW)

(73) Assignee: WISTRON CORP., New Taipei (TW)

( * ) Notice: Subject to any disclaimer, the term of this patent is extended or adjusted under 35 U.S.C. 154(b) by 0 days.

(21) Appl. No.: 16/739,202

(22) Filed: Jan. 10, 2020

(65) Prior Publication Data

US 2021/0068289 A1 Mar. 4, 2021

(30) Foreign Application Priority Data

Aug. 27, 2019 (CN) .......................... 201910796563.9

(51) Int. Cl.
*H05K 7/00* (2006.01)
*H05K 7/14* (2006.01)
*H05K 5/00* (2006.01)

(52) U.S. Cl.
CPC ......... *H05K 7/1407* (2013.01); *H05K 5/0008* (2013.01); *H05K 7/1485* (2013.01)

(58) Field of Classification Search
None
See application file for complete search history.

(56) References Cited

U.S. PATENT DOCUMENTS

| | | | | |
|---|---|---|---|---|
| 5,335,142 A | * | 8/1994 | Anderson | F16M 11/10 248/183.2 |
| 5,340,340 A | * | 8/1994 | Hastings | G06F 1/181 312/223.1 |
| 5,796,576 A | * | 8/1998 | Kim | G06F 1/1616 361/679.28 |
| 6,788,527 B2 | * | 9/2004 | Doczy | G06F 1/1626 312/208.1 |
| 6,867,961 B2 | * | 3/2005 | Choi | G06F 1/1681 248/176.3 |

(Continued)

FOREIGN PATENT DOCUMENTS

| CN | 103857240 A | 6/2014 |
|---|---|---|
| TW | 201345376 A | 11/2013 |

OTHER PUBLICATIONS

Taiwan Patent Office, "Office Action", dated Apr. 13, 2020, China.

*Primary Examiner* — Anthony Q Edwards
*Assistant Examiner* — Rashen E Morrison
(74) *Attorney, Agent, or Firm* — Locke Lord LLP; Tim Tingkang Xia, Esq.

(57) ABSTRACT

The disclosure relates to a casing assembly, and a casing assembly and electronic device having the same. The casing assembly includes a first casing, a second casing and a fixing assembly. The second casing is slidably disposed on the first casing. The fixing assembly includes a mount, a fastener and a pressure supply component. The mount is disposed on the first casing. The fastener is disposed on the second casing. The fastener is detachably engaged with the mount. The pressure supply component is movably disposed on one of the mount and the fastener and configured to push the other one of the mount and the fastener. When the fastener is disengaged from the mount, the pressure supply component forces the fastener and the mount to move away from each other so as to force the second casing to move relative to the first casing.

20 Claims, 12 Drawing Sheets

(56) References Cited

U.S. PATENT DOCUMENTS

| | | | | |
|---|---|---|---|---|
| 6,952,340 B2* | 10/2005 | Son | G06F 1/3262 | 361/679.09 |
| 7,129,931 B2* | 10/2006 | Pappas | G06F 1/1601 | 345/168 |
| 7,130,186 B2* | 10/2006 | Yu | G06F 1/1616 | 361/679.27 |
| 7,298,610 B2* | 11/2007 | Kim | G06F 1/1616 | 248/918 |
| 7,345,871 B2* | 3/2008 | Lev | G06F 1/162 | 16/327 |
| 7,375,956 B2* | 5/2008 | Chuang | E05D 3/10 | 16/312 |
| 7,551,431 B2* | 6/2009 | Nakajima | G06F 1/162 | 361/679.06 |
| 7,652,873 B2* | 1/2010 | Lee | E05B 65/006 | 361/679.06 |
| 7,656,661 B2* | 2/2010 | Shaum | G06F 1/1643 | 361/679.55 |
| 7,706,137 B2* | 4/2010 | Iijima | G06F 1/1679 | 361/679.07 |
| 7,800,893 B2* | 9/2010 | Tracy | G06F 1/162 | 361/679.27 |
| 8,437,126 B2* | 5/2013 | Holung | G06F 1/1654 | 361/679.29 |
| 8,496,304 B2* | 7/2013 | Liu | G06F 1/187 | 312/223.2 |
| 8,537,529 B2* | 9/2013 | Qiu | G06F 1/1681 | 361/679.02 |
| 8,861,187 B2* | 10/2014 | Takahashi | G06F 1/162 | 361/679.06 |
| 9,207,709 B2* | 12/2015 | Xie | G06F 1/187 | |
| 10,481,648 B2* | 11/2019 | Schulze | G06F 1/185 | |
| 2002/0109962 A1* | 8/2002 | Tseng | G06F 1/1643 | 361/679.05 |
| 2004/0090742 A1* | 5/2004 | Son | G06F 1/3203 | 361/679.09 |
| 2006/0120170 A1* | 6/2006 | Chen | G06F 1/187 | 365/189.05 |
| 2008/0057781 A1* | 3/2008 | Chen | H01R 13/639 | 439/577 |
| 2008/0128579 A1* | 6/2008 | Chen | G11B 33/124 | 248/694 |
| 2008/0238816 A1* | 10/2008 | Matsushita | G06F 1/1643 | 345/30 |
| 2010/0142159 A1* | 6/2010 | Lee | G06F 1/187 | 361/747 |
| 2011/0134599 A1* | 6/2011 | Li | G06F 1/187 | 361/679.34 |
| 2012/0293938 A1* | 11/2012 | Dai | G06F 1/1624 | 361/679.07 |
| 2013/0279973 A1 | 10/2013 | Li | | |

* cited by examiner

FIXING ASSEMBLY, CASING ASSEMBLY, AND ELECTRONIC DEVICE

CROSS-REFERENCE TO RELATED APPLICATIONS

This non-provisional application claims priority under 35 U.S.C. § 119(a) on Patent Application No(s). 201910796563.9 filed in China on Aug. 27, 2019, the entire contents of which are hereby incorporated by reference.

TECHNICAL FIELD

The disclosure relates to a fixing assembly, a casing assembly, and an electronic device, more particularly to a fixing assembly, a casing assembly, and an electronic device that have pressure supply component.

BACKGROUND

With the development of technology, electronic devices, such as computers and servers, often contain various function modules for various requirements of cloud services. Take the server as an example, the server rack is usually equipped with different function modules, such as hard disk module, memory module, and disk array card module, for providing different services, some of the function modules are removably placed on the server rack so that the user or maintenance personnel can pull them out from the server rack for maintenance or other purposes.

In addition, in order to facilitate the user to take out the function module, the most common approach is to additionally add a handle on the function module. However, the devices on the server are usually arranged in a compact manner to fully utilize the internal space of the server, thus the space around the function module is not sufficient for the handle. Without the handle, it would be difficult to take out the function modules and would affect the maintenance.

It is understood that the foregoing issue does not only occur in the server but also occur in other electronic devices that require taking out function module from limited internal space.

SUMMARY

One embodiment of the disclosure provides a casing assembly including a first casing, a second casing and a fixing assembly. The second casing is slidably disposed on the first casing. The fixing assembly includes a mount, a fastener and a pressure supply component. The mount is disposed on the first casing. The fastener is disposed on the second casing. The fastener is detachably engaged with the mount. The pressure supply component is movably disposed on one of the mount and the fastener and configured to push the other one of the mount and the fastener. When the fastener is disengaged from the mount, the pressure supply component forces the fastener and the mount so as to force the second casing to move relative to the first casing.

Another embodiment of the disclosure provides a fixing assembly including a mount, a fastener and a pressure supply component. The fastener is detachably engaged with the mount. The pressure supply component is movably disposed on one of the mount and the fastener and configured to push the other one of the mount and the fastener. When the fastener is disengaged from the mount, the pressure supply component forces the fastener and the mount to move away from each other.

Another embodiment of the disclosure provides an electronic device including a first casing, a removable function module and a fixing assembly. The removable function module is slidably disposed on the first casing. The fixing assembly includes a mount, a fastener and a pressure supply component. The mount is disposed on the first casing. The fastener is disposed on the removable function module. The fastener is detachably engaged with the mount. The pressure supply component is movably disposed on one of the mount and the fastener and configured to push the other one of the mount and the fastener. When the fastener is disengaged from the mount, the pressure supply component forces the fastener and the mount so as to force the removable function module to move relative to the first casing.

BRIEF DESCRIPTION OF THE DRAWINGS

The present disclosure will become better understood from the detailed description given hereinbelow and the accompanying drawings which are given by way of illustration only and thus are not intending to limit the present disclosure and wherein.

DETAILED DESCRIPTION

Figure 1:
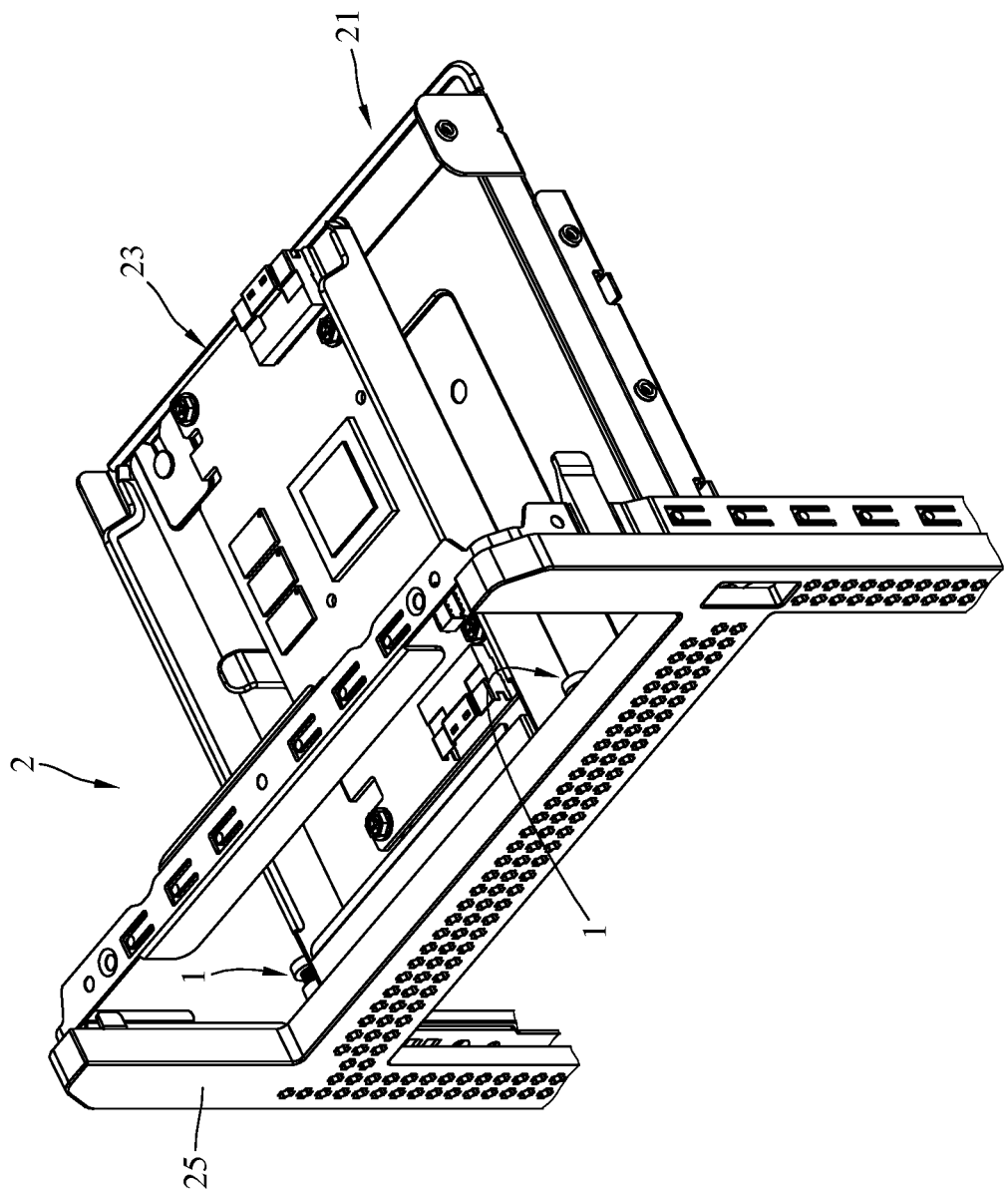
FIG. 1 is a perspective view of a casing assembly for an electronic device according to one embodiment of the disclosure.

In the following detailed description, numerous specific details are illustrated in order to provide a thorough understanding of the disclosed embodiments. It will be apparent, however, that one or more embodiments may be practiced without these specific details.

In addition, well-known structures and devices are drawn schematically in order to simplify the drawing. And the size or ratio of the features in the drawings of the present disclosure may be exaggerated for illustrative purposes, but the present disclosure is not limited thereto. Note that the actual size and designs of the product manufactured based on teaching and suggestion of the present disclosure may also be properly modified according to any actual requirement.

In addition, terms, such as "end", "part", "portion" or "area" may be used in the following paragraphs to describe specific element and structure or specific technical feature on or between them, but these elements, structure and technical feature are not limited by these terms. Also, term "and/or" may be used in the following paragraphs to indicate a combination comprising one of listed elements and all of the listed elements. Further, terms, such as "substantially", "approximately" or "about" may be used in the following paragraphs; when these terms are used in combination with size, concentration, temperature or other physical or chemical properties or characteristics, they are used to express that, the deviation existing in the upper and/or lower limits of the range of these properties or characteristics or the acceptable tolerances caused by the manufacturing tolerances or analysis process, would still able to achieve the desired effect.

Furthermore, unless otherwise defined, all the terms used in the disclosure, including technical and scientific terms, have their ordinary meanings that can be understood by those skilled in the art. Moreover, the definitions of the above terms are to be interpreted as being consistent with the technical fields related to the disclosure. Unless specifically defined, these terms are not to be construed as too idealistic or formal meanings.

Figure 2:
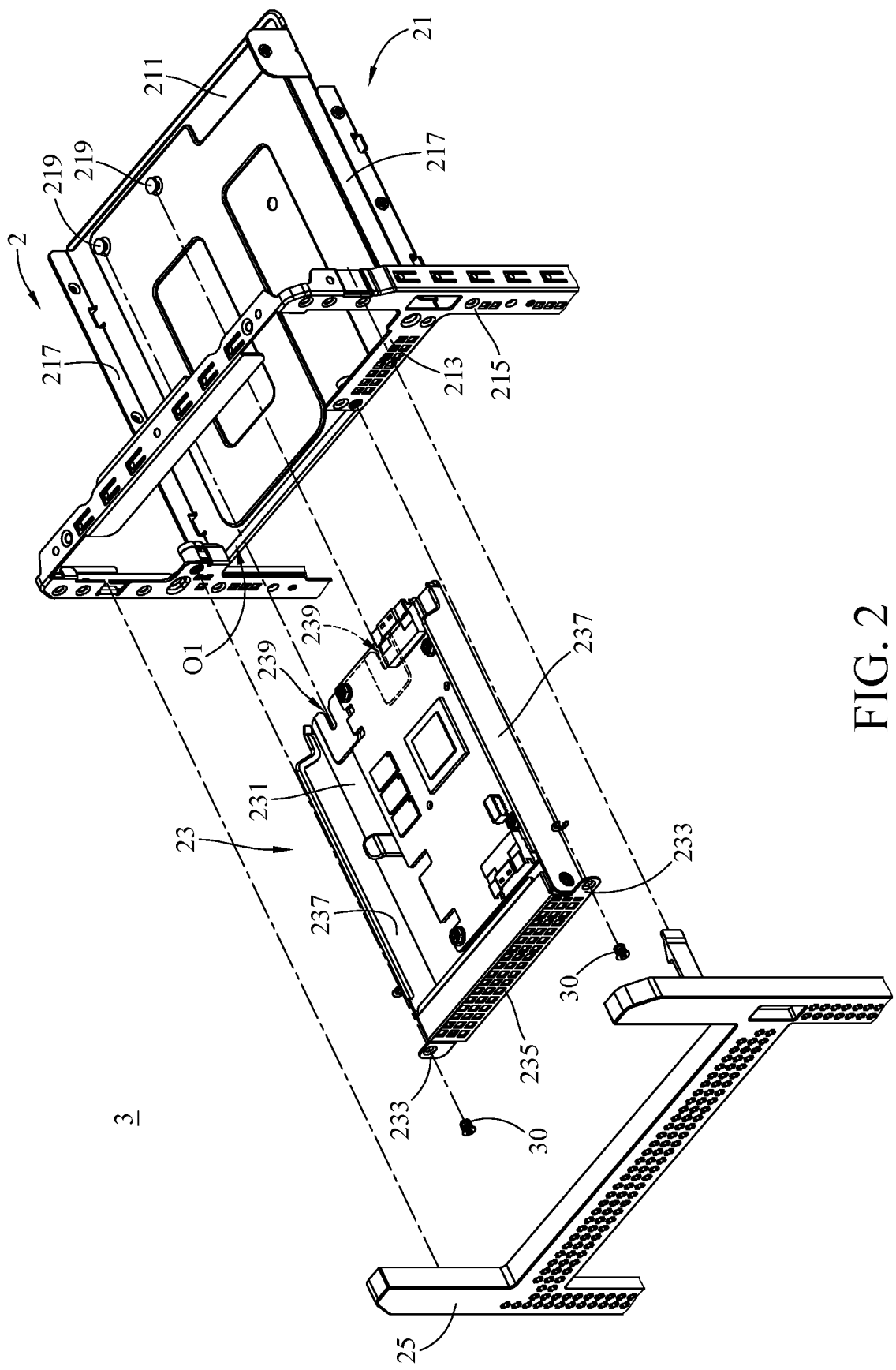
FIG. 2 is an exploded perspective view of the casing assembly in FIG. 1.

Firstly, one embodiment of the disclosure provides a casing assembly 2 applicable for an electronic device 3, referring to FIGS. 1-2, FIG. 1 is a perspective view of the casing assembly 2 for the electronic device 3 according to one embodiment of the disclosure, and FIG. 2 is an exploded perspective view of the casing assembly 2 in FIG. 1. The electronic device 3 is, for example, but not limited to a server. For the purpose of illustrating the spirit of the disclosure, the drawings may only show part of the electronic device 3 and part of the casing assembly 2. Note that the disclosure is not limited to the type of the server to which the casing assembly of the disclosure is applicable to or the server shown in the drawings; that is, the disclosure is not limited to be applicable to the field of server. For example, in some other embodiments, the electronic device of the disclosure may be another type of server or computer host. In addition, for the purpose of simple illustration and clarity, some components or unnecessary details on the casing assembly 2, such as cables, fans, other casings, and other part of the electrical component, were simplified or omitted from the drawings.

In this embodiment and some other embodiments, the casing assembly 2 includes a first casing 21 and a second casing 23. The second casing 23 is slidably disposed on the first casing 21. As shown in FIG. 2, the first casing 21 has an opening O1, and the second casing 23 is allowed to be placed into the first casing 21 via the opening O1. In addition, the first casing 21 and the second casing 23 are made of, for example, metal, but the disclosure is not limited thereto.

In detail, in this embodiment or some other embodiments, the first casing 21 includes a first bottom plate 211, a first front plate 213, a frame body 215, and at least one first side plate 217. The first front plate 213 and the frame body 215 are, for example, made of a single piece, and the first front plate 213 and the frame body 215 are disposed on the same side of the first bottom plate 211. The opening O1 is formed on the first front plate 213. In this embodiment, there are two first side plates 217, and the first side plates 217 are respectively located at two opposite sides of the first bottom plate 211. In such a configuration, the first front plate 213, the first side plates 217, and the first bottom plate 211 together form a space (not labeled) connected to the opening O1. The second casing 23 is allowed to be put into the space via the opening O1. Note that such space may be sufficient to accommodate other required components other than the second casing 23, but the disclosure is not limited thereto.

The second casing 23 includes a second bottom plate 231, a second front plate 235, and at least one second side plate 237. The second front plate 235 is disposed at one side of the second bottom plate 231. In this embodiment, there are two second side plates 237, and the second side plates 237 are respectively located at two opposite sides of the second bottom plate 231. In such a configuration, the second front plate 235, the second side plates 237 and the second bottom plate 231 together form a space (not labeled) for accommodating various electrical components (not labeled) required by the electronic device 3. Note that the second casing 23 and the electrical components accommodated therein together form a removable function module. The removable function module is, for example, but not limited to a RAID card module, but the disclosure is not limited thereto. In addition, in this embodiment, the second front plate 235 of the second casing 23 has a plurality of vents (not labeled) allowing airflow to pass therethrough, but the disclosure is not limited thereto.

Further, in this embodiment or some other embodiments, the first casing 21 further includes at least one guide structure 219, and the second casing 23 further includes at least one guide structure 239. As shown in FIG. 2, in this embodiment, there are two guide structures 219 protruding from the first bottom plate 211 of the first casing 21 and are spaced apart from each other, and there are two guide structures 239 formed on the second bottom plate 231 of the second casing 23 and spaced apart from each other. In this embodiment, each of the guide structures 219 is, for example, but not limited to a positioning pin, and the positioning pin may be a T-shaped positioning pin having a head portion (not labeled) with larger width and a neck portion (not labeled) with a smaller width; and the guide structure 239 is, for example, but not limited to a sliding slot, where the sliding slot has a width slightly larger than that of the neck portion and smaller than that of the head portion. In such a configuration, when the second bottom plate 231 of the second casing 23 is moved along the first bottom plate 211 of the first casing 21, the guide structures 219 on the first bottom plate 211 of the first casing 21 are allowed to enter the guide structures 239 on the second bottom plate 231 of the second casing 23 so as to guide the second casing 23 to move in a predetermined direction. When the guide structures 219 reach the close ends (not labeled) of the guide structures 239, the second casing 23 is stopped at a predetermined position.

Note that the disclosure is not limited to the designs of the guide structures 219 on the first bottom plate 211 of the first casing 21 and the guide structures 239 on the second bottom plate 231 of the second casing 23, any other suitable designs that can guide the second casing to the desired position may be employed as the guide structures on the first and second casings; for example, in some other embodiments, the guide structure on the first casing may be a sliding slot, and the guide structure on the second casing may be a protrusion extending toward the first casing; alternatively, in some other embodiments, the guide structures on the first and second casings may be a protrusion and a mating slot that are in other shapes. In addition, the quantities of the guide structures on the first and second casings can be changed according to actual requirements; in some embodiments, the first casing may have only one or more of the guide structures, and the second casing may have only one or more of the mating guide structures; alternatively, in some other embodiments, the first and second casings may not have any of the aforementioned guide structures.

Figure 3:
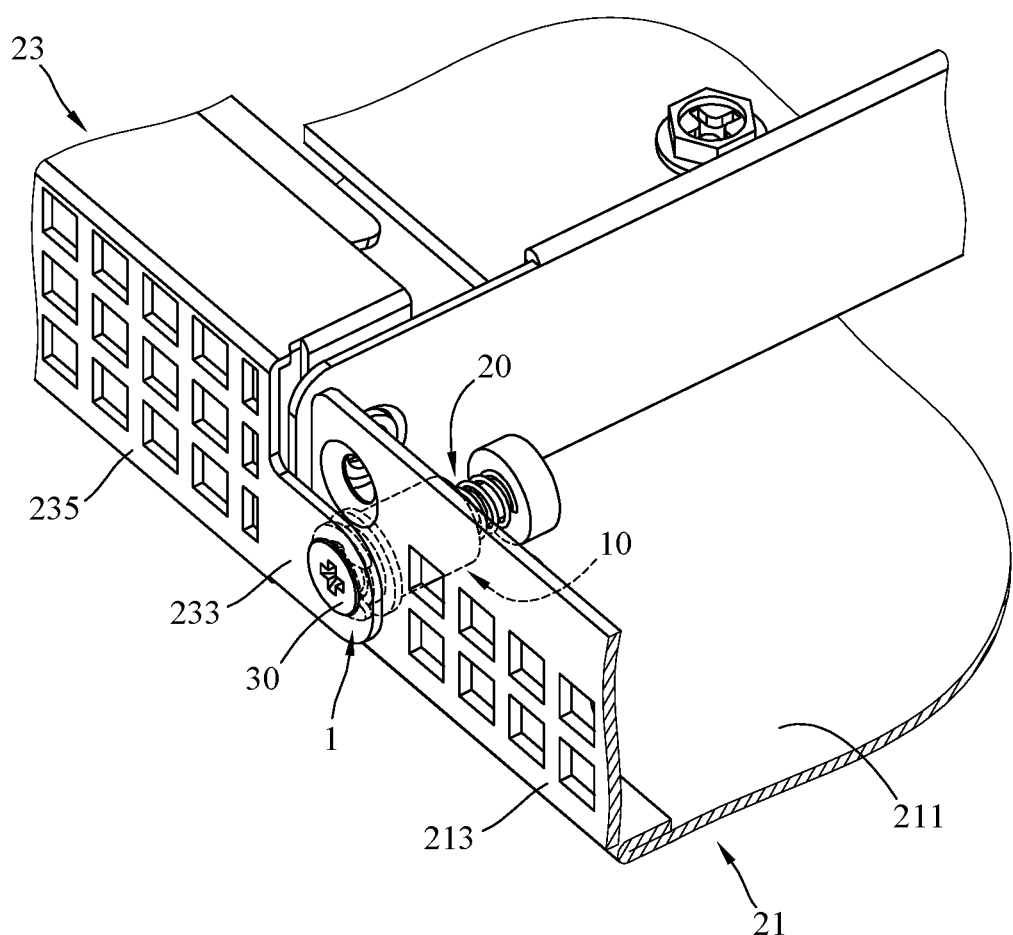
FIG. 3 is a partial enlarged perspective view of the casing assembly in FIG. 1.
Figure 5:
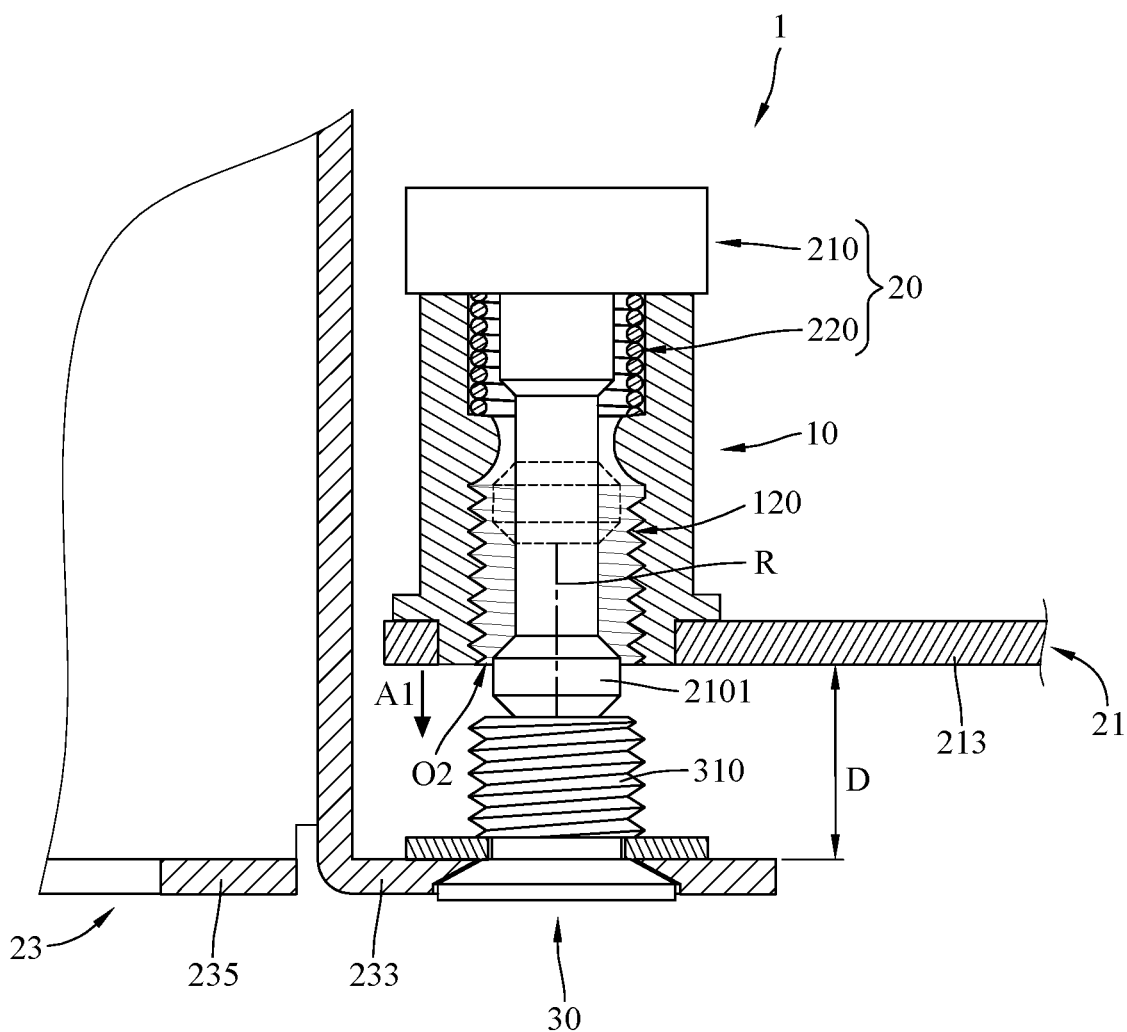
FIG. 5 is a partial enlarged cross-sectional view of the casing assembly when a fixing assembly in FIG. 4 is switched from an assembled position to a pushing-outward position.
Figure 6:
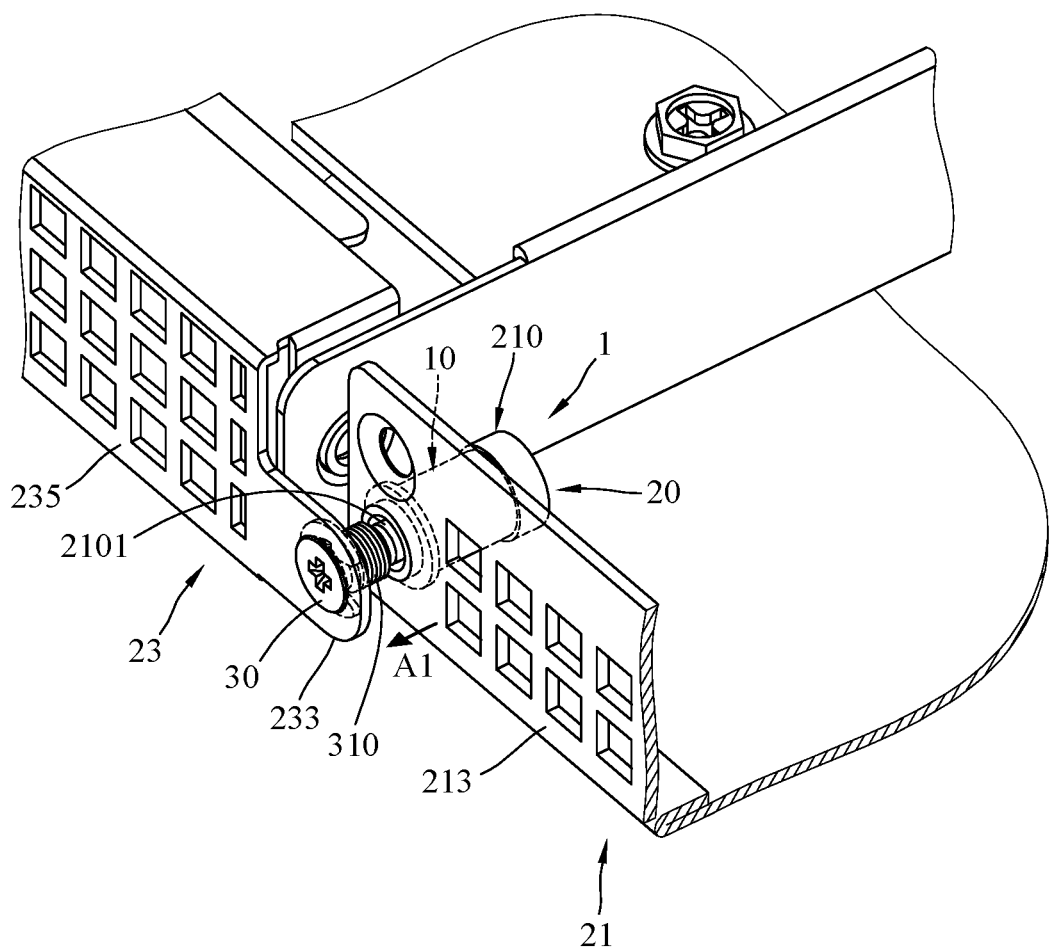
FIG. 6 is a perspective view of the casing assembly in FIG. 5 when the casing assembly is in a released status.

In this embodiment or some other embodiments, the second casing 23 further includes at least one tab portion 233. As shown in FIG. 2, in this embodiment, there are two tab portions 233 respectively located at two opposite sides of the second front plate 235. When the second casing 23 is slide to the predetermined position along the first casing 21, the tab portion 233 of the second casings 23 are respectively located at two opposite sides of the opening O1 of the first casing 21 and covers part of the first front plate 213 of the first casing 21; in other words, the tab portions 233 of the second casing 23 are substantially stacked on the first front plate 213 of the first casing 21. In this embodiment and some other embodiments, as shown in FIG. 1, the fixing assembly 1 is disposed on the first front plate 213 of the first casing 21 and at least one of the tab portions 233. The fixing assembly 1 is configured to fix the tab portion 233 of the second casing 23 to the first front plate 213 of the first casing 21 so as to fix the second casing 23 to the first casing 21. When the second casing 23 is fixed to the first casing 21, the casing assembly 2 is in a closed status (as shown in FIG. 1 or in FIG. 3 illustrated in later paragraphs). In addition, the engagement between the first casing 21 and the second casing 23 can be released by operating the fixing assembly 1, and the fixing assembly 1 is able to push the tab portion 233 of the second casing 23 away from the first front plate 213 of the first casing 21 to make part of the second casing 23 protrude further outward from the opening O1 of the first casing 21, creating a gap D (as shown in FIG. 5 illustrated in later paragraphs) between the tab portion 233 of the second casing 23 and the first front plate 213 of the first casing 21. As the gap D occurs, the casing assembly 2 is switched to a released status (as shown in FIG. 6 illustrated in later paragraphs), but the detail descriptions are illustrated in the following paragraphs.

In addition, in this embodiment or some other embodiments, the casing assembly 2 further includes a front cover 25, and the front cover 25 is detachably disposed on the frame body 215 of the first casing 21 to cover the frame body 215 and the first front plate 213 of the first casing 21 and the opening O1 on the first front plate 213. In this embodiment, the front cover 25 has a plurality of vents (not labeled), and airflow is allowed to pass through the vents on both of the front cover 25 and the second front plate 235, but the disclosure is not limited thereto. Note that the front cover 25 is optional; in some embodiments, the casing assembly may not include the front cover 25.

The fixing assemblies 1 on both sides of the second casing 23 are substantially the same, thus only one of the fixing assemblies 1 will be illustrated in detail in the following paragraphs.

Figure 4:
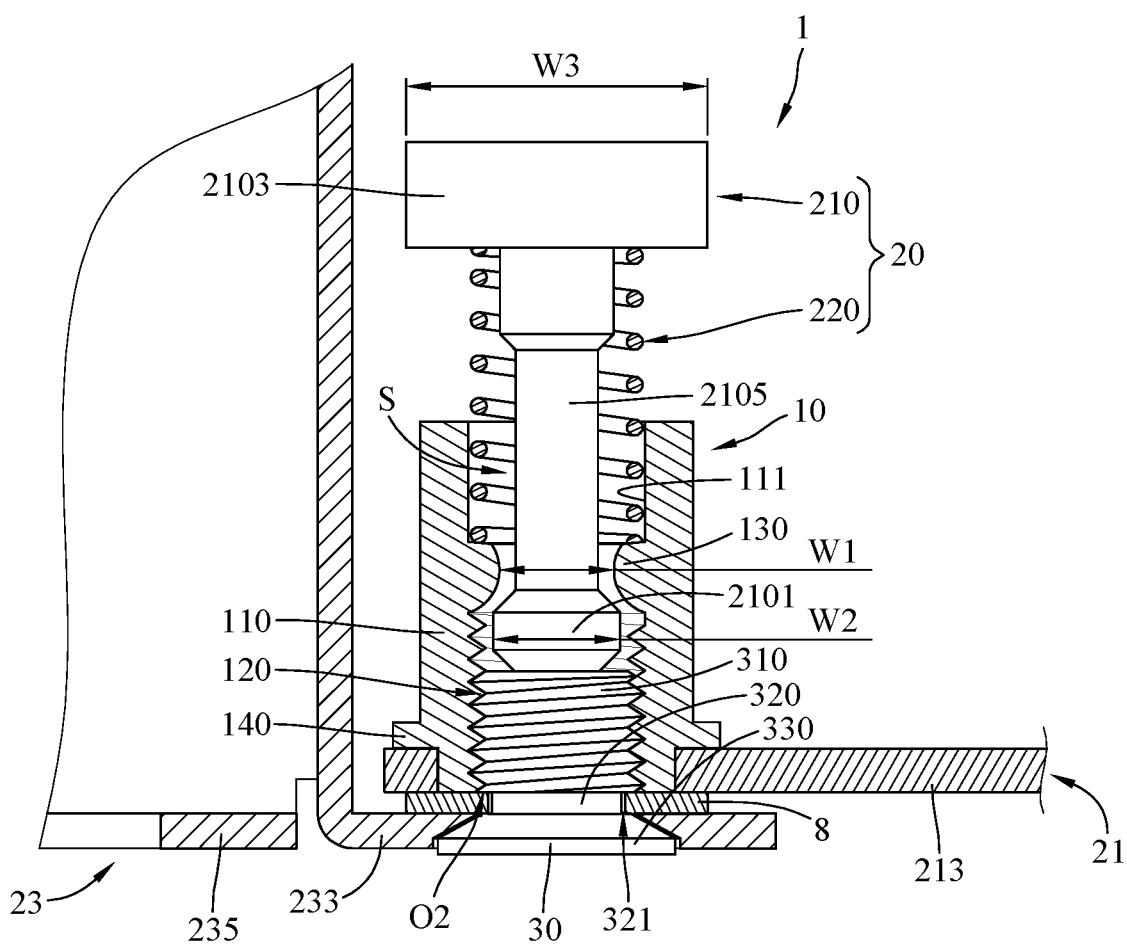
FIG. 4 is a partial enlarged cross-sectional view of the casing assembly in FIG. 1.

Referring to FIGS. 3-4, where FIG. 3 is a partial enlarged perspective view of the casing assembly 2 in FIG. 1, and FIG. 4 is a partial enlarged cross-sectional view of the casing assembly 2 in FIG. 1. Note that the frame body 215 is omitted from the later drawings for the purpose of simple illustration and clarity.

Firstly, in this embodiment and some other embodiments, the fixing assembly 1 includes a mount 10, a pressure supply component 20, and a fastener 30. The material of the mount 10 is not particularly restricted. The mount 10 is, for example, made of a single piece, but the disclosure is not limited thereto. The mount 10 is fixed on the first front plate 213 of the first casing 21, the fastener 30 is movably fixed on the second front plate 235 of the second casing 23 and is able to be detachably engaged with the mount 10, and the pressure supply component 20 is movably disposed on the mount 10 and is able to removably push or contact the fastener 30 so as to apply force on the fastener 30 for forcing the fastener 30 to move away from the mount 10. As shown in FIG. 4, when the fastener 30 is engaged with the mount 10, the fixing assembly 1 is in the assembled position and keeps the position of the second casing 23 with respect to the first casing 21 and thus keeping the casing assembly 2 in the closed status.

In this embodiment or some other embodiments, the mount 10 includes a main body part 110, an engagement portion 120, an inner protrusion 130, and a flange portion 140. At least part of the main body part 110 is mounted on the first front plate 213 of the first casing 21 in a tight-fitting manner or via screws, adhesive or any other suitable means. The main body part 110 is, for example, a hollow cylinder. The main body part 110 includes an accommodation portion S and an inner wall 111. The accommodation portion S is the hollow portion in the main body part 110. The accommodation portion S has an opening O2. The inner wall 111 forms and surrounds the accommodation portion S. The engagement portion 120 is formed on the main body part 110 and located in the accommodation portion S. More specifically, the engagement portion 120 is located adjacent to the opening O2 of the accommodation portion S and is configured to be engaged with the fastener 30. In this embodiment, the engagement portion 120 is, for example, internal thread formed on the inner wall 111 of the main body part 110 and located in the accommodation portion S, but the disclosure is not limited to the design of the internal thread.

The inner protrusion 130 is formed on the main body part 110 and protrudes inward from the inner wall 111; therefore, the inner protrusion 130 is also located in the accommodation portion S. More specifically, the inner protrusion 130 is located further away from the opening O2 than the engagement portion 120. More specifically, the inner protrusion 130 is an annular protrusion protruding inward from the inner wall 111, such that the bore diameter (e.g. the width W1 shown in FIG. 4) of the accommodation portion S at the inner protrusion 130 is smaller or narrower than other parts of the accommodation portion S. It is understood that the disclosure is not limited to the configuration of the inner protrusion 130; for example, in some embodiments, the inner protrusion may be a plurality of smaller and separated protrusions protruding inward from the inner wall of the main body part.

The flange portion 140 is located at the main body part 110 and protrudes outward from, for example, an outer wall (not labeled) of the main body part 110. The flange portion 140 is abutting on the first front plate 213 of the first casing 21 so as to improve the stability of the mount 10 on the first casing 21. In some embodiments, the flange portion 140 can be fixed to the first front plate 213 of the first casing 21 via screws so as to further improve the connection between the mount 10 and the first casing 21. Note that the flange portion 140 is optional, and the disclosure is not limited to the design of the flange portion 140.

In this embodiment or some other embodiments, the pressure supply component 20 includes a push part 210 and an elastic part 220. The material of the push part 210 is not particularly restricted. The push part 210 is, for example, made of a single piece, but the disclosure is not limited thereto. The push part 210 is movably disposed on the mount 10. More specifically, the push part 210 includes a push end portion 2101, a distal portion 2103, and an extension portion 2105. The push end portion 2101 is connected to the distal portion 2103 via the extension portion 2105. The extension portion 2105 is disposed through the bore at the inner protrusion 130 of the accommodation portion S of the mount 10 and is movably located in the accommodation portion S. The push end portion 2101 is movably located at the engagement portion 120 of the mount 10. As such, the inner protrusion 130 of the mount 10 is located between the distal portion 2103 and the push end portion 2101. As shown in FIG. 4, the width W1 of the accommodation portion S at the inner protrusion 130 is smaller than the width W2 of the push end portion 2101 and also smaller than the width W3 of the distal portion 2103. Therefore, the distal portion 2103 and the push end portion 2101 are prevented from sliding over the inner protrusion 130, preventing the push part 210 from falling off from the mount 10.

In this embodiment or some other embodiments, the elastic part 220 is disposed between the push part 210 and the mount 10. More specifically, two opposite ends of the elastic part 220 are respectively fixed on the inner protrusion 130 of the mount 10 and the extension portion 2105 or distal portion 2103 in a tight-fitting manner or via adhesive or other suitable means, and the disclosure is not limited thereto. In this embodiment, the elastic part 220 is, for example, but not limited to an extension spring. In FIG. 4, the elastic part 220 is in a stretched status and stores elastic potential energy for pulling the push part 210 in a direction toward the fastener 30. Therefore, the elastic part 220 is able to apply force for forcing the fastener 30 to move away from the mount 10 by forcing the push end portion 2101 to push the fastener 30. On the other hand, it is understood that, when the fastener 30 is engaged with the mount 10, the elastic potential energy stored in the elastic part 220 makes the push end portion 2101 of the push part 210 tightly contact the fastener 30, further improving the engagement between the fastener 30 and the mount 10.

In the disclosure, the material of the fastener 30 is not particularly restricted. The fastener 30 is, for example, made of a single piece, but the disclosure is not limited thereto. In this embodiment or some other embodiments, the fastener 30 includes a screw portion 310, a neck portion 320, and an actuating portion 330. The screw portion 310 is connected to the actuating portion 330 via the neck portion 320. The screw portion 310 is the part of the fastener 30 for being engaged with the engagement portion 120 of the mount 10. The screw portion 310 protrudes from a surface of the tab portion 233 of the second casing 23 facing toward the first front plate 213 of the first casing 21. The screw portion 310 has external thread on its outer surface, and the external thread can be engaged with the internal thread of the engagement portion 120 of the mount 10. The neck portion 320 is rotatably disposed through the tab portion 233 of the second casing 23, such that the actuating portion 330 and the screw portion 310 are respectively located at two opposite sides of the tab portion 233. The actuating portion 330 is the part of the fastener 30 for the user to operate the fastener 30.

The actuating portion 330 has, for example, a cross slot (as shown in FIG. 3) or other shape of slots, thus the user is allowed to use hand tool (e.g., Phillip screwdriver or cabinet tip screwdriver) to rotate the actuating portion 330. When the actuating portion 330 is rotated, the screw portion 310 is rotated relative to the tab portion 233 of the second casing 23. Note that the disclosure is not limited to the slot on the actuating portion 330.

In addition, in this embodiment or some other embodiments, the neck portion 320 of the fastener 30 has an annular slot 321, and a holding component 8 is suitable to be arranged in the annular slot 321, such that the holding component 8 and the actuating portion 330 are able to prevent the neck portion 320 of the fastener 30 from falling off from the tab portion 233 of the second casing 23. In this embodiment, the holding component 8 is, for example, a C clip, but the disclosure is not limited thereto. Note that the disclosure is not limited to the holding component 8 that is used to fix the fastener 30 to the tab portion 233 of the second casing 23. For example, in some other embodiments, the neck portion of the fastener can have external thread engagable with internal thread formed on the tab portion of the second casing; in such as case, the fastener is rotatably fixed on the tab portion of the second casing.

Then, referring to FIGS. 5-6, how to switch status of the casing assembly 2 by the fixing assembly 1 is illustrated, wherein FIG. 5 is a partial enlarged cross-sectional view of the casing assembly 2 when the fixing assembly 1 is switched from assembled position to pushing-outward position; and FIG. 6 is a perspective view of the casing assembly 2 when the casing assembly 1 is in released status.

Firstly, the fastener 30 can be rotated by using a hand tool, with the rotation of the fastener 30, the screw portion 310 of the fastener 30 is gradually released from the engagement portion 120 of the mount 10. As the screw portion 310 of the fastener 30 is completely released and disengaged from the engagement portion 120 of the mount 10, the elastic potential energy stored in the elastic part 220 of the pressure supply component 20 is released and forces the push end portion 2101 of the push part 210 to push the fastener 30 outward. As a result, the fastener 30 is forced to be moved away from the engagement portion 120 of the mount 10 (e.g., in the direction of arrow A1). During the outward movement of the fastener 30, the second casing 23 that is fixed with the fastener 30 is also forced by the elastic part 220 of the pressure supply component 20 and moved away from the first casing 21 by being pushed by the push end portion 2101. Therefore, the tab portion 233 of the second casing 23 and the first front plate 213 of the first casing 21 is spaced apart by a gap D. As shown in FIG. 5, the push end portion 2101 is movable along a movement path R which passes through the engagement portion 120 of the mount 10. That is, when the fastener 30 is disengaged from the mount 10, the elastic part 220 is able to force the push end portion 2101 of the push part 210 to move to the opening O2 of the mount 10. At this moment, the fixing assembly 1 is switched to the pushing-outward position from the assembled position, and the elastic part 220 of the pressure supply component 20 is able to keep the push end portion 2101 in the current position so as to keep the fixing assembly 1 in the pushing-outward position, and thereby keeping the gap D between the tab portion 233 of the second casing 23 and the first front plate 213 of the first casing 21 and keeping the casing assembly 2 in the released status. The gap D is, for example, in a size that allows a human finger to pass therethrough. As such, when the fixing assembly 1 is switched to the pushing-outward position, a user's finger is allowed to put into the gap D so that the user is able to easily grab or hold, for example, the tab portion 233 of the second casing 23 to pull out the second casing 23 of the first casing 21.

That is, by switching the fixing assembly 1 to the pushing-outward position, part of the second casing 23 can be sprung outward from the first casing 21 to form a temporary handle for the user to pull the whole second casing 23 out of the first casing 21 in a way of grabbing the protruding part of the second casing 23.

Therefore, even though there is no conventional handle disposed on the second casing 23, part of the second casing 23 being pushed outward by the fixing assembly 1 can be taken as a temporary handle for the user to easily pull the whole second casing 23 out of the first casing 21, thereby avoiding the problem that the removal and installation of the conventional function module are difficult to perform without handle. In comparison, the fixing assembly 1 saves the cost on addition handle and helps to improve and facilitate the maintenance of the function module.

Figure 7A:
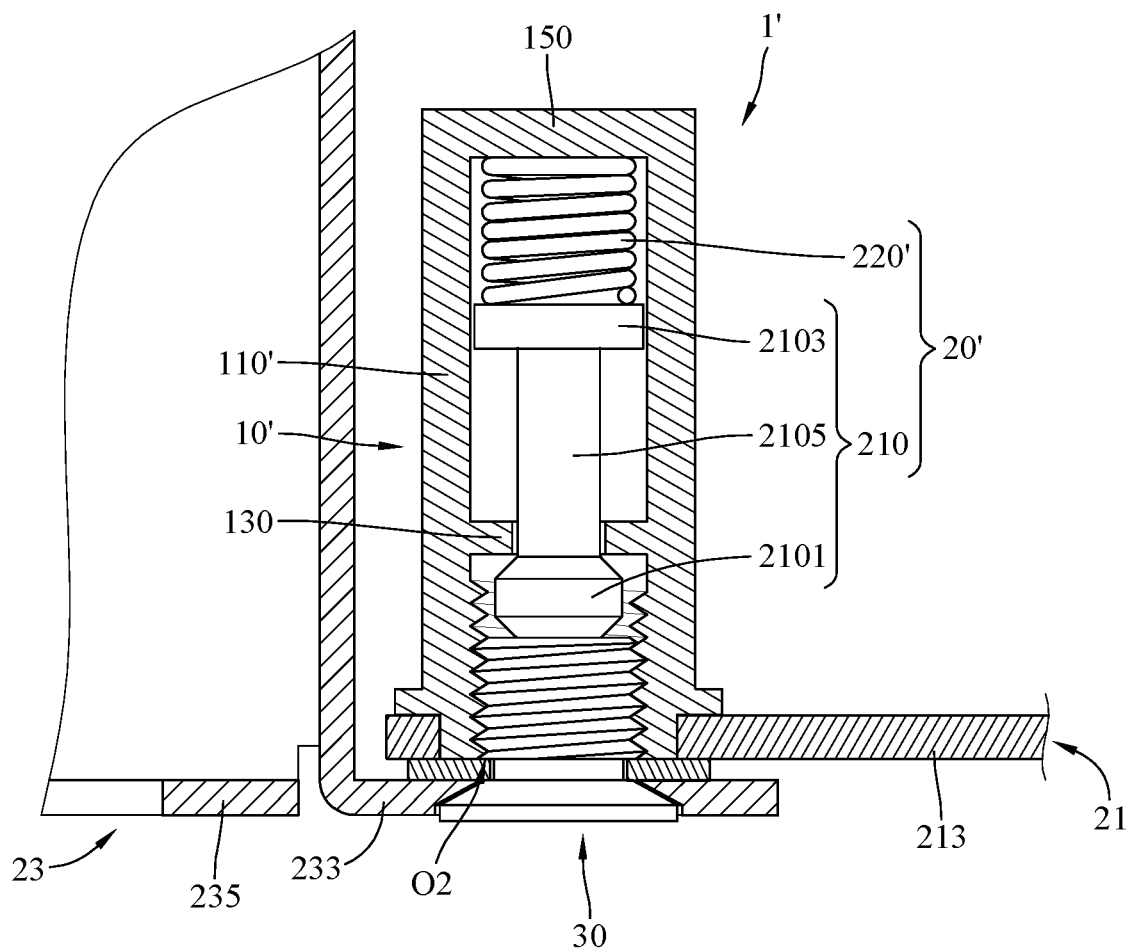
FIG. 7A is a partial enlarged cross-sectional view of a fixing assembly according to another embodiment of the disclosure when the fixing assembly is in the assembled position.
Figure 7B:
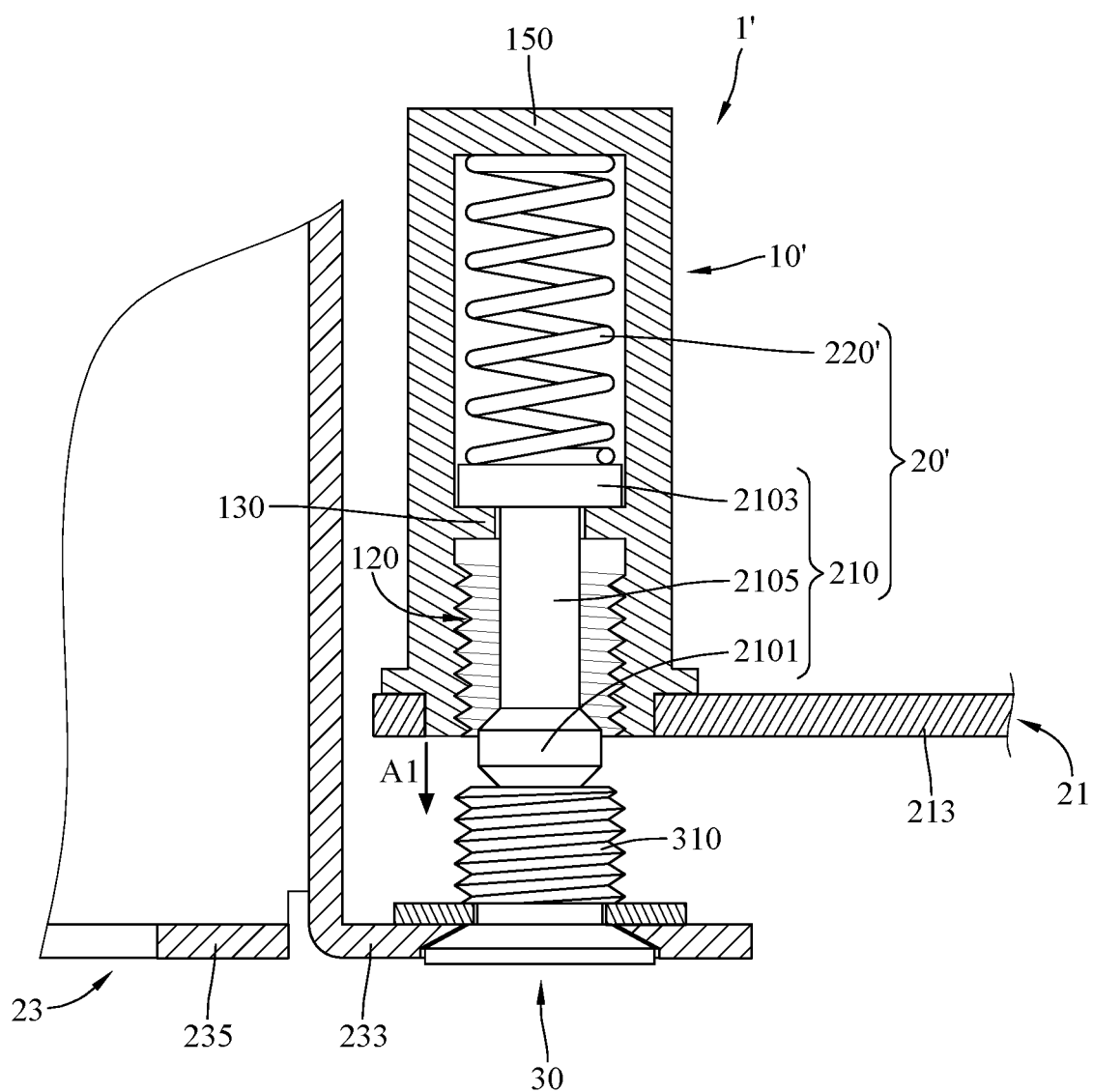
FIG. 7B is a partial enlarged cross-sectional view of the fixing assembly in FIG. 7A when the fixing assembly is in the pushing-outward position.

The above is one of the exemplary embodiments of the disclosure, and the disclosure is not limited thereto. Referring to FIGS. 7A-7B, the disclosure provides a fixing assembly 1', wherein FIG. 7A is a partial enlarged cross-sectional view of the assembled position of the fixing assembly 1', and FIG. 7B is a partial enlarged cross-sectional view of the pushing-outward position of the fixing assembly 1'. It is noted that, for the purpose of simple illustration and clarity, the following paragraphs only describe the main differences between the fixing assembly 1' of this embodiment and the fixing assembly in the previous embodiment, and the descriptions for the same or similar features will not be repeated hereinafter.

In this embodiment, the fixing assembly 1' includes a mount 10' and a pressure supply component 20'. The mount 10' further includes an end cover portion 150, the end cover portion 150 is located at a side of the main body part 110 opposite to the opening O2, the distal portion 2103 of the push part 210 of the pressure supply component 20' is movably located between the end cover portion 150 of the mount 10' and the inner protrusion 130, and the elastic part 220' of the pressure supply component 20' is, for example, a compression spring, but the disclosure is not limited thereto. Two opposite ends of the elastic part 220' are respectively fixed to the end cover portion 150 of the mount 10' and the distal portion 2103 of the push part 210. In FIG. 7A, the elastic part 220' is in a compressed status and stores elastic potential energy that can force the push part 210 to move toward the fastener 30. Note that the elastic part 220' of this embodiment may be replaced with other suitable objects that have properties, such as compressible and self-returning (e.g., a rubber block).

Similarly, the fastener 30 can be rotated by a hand tool, such that the screw portion 310 of the fastener 30 is gradually disengaged from the engagement portion 120 of the mount 10'. As the screw portion 310 of the fastener 30 is completely disengaged and released from the engagement portion 120 of the mount 10', the elastic potential energy stored in the elastic part 220' of the pressure supply component 20' is released to force the push part 210 to push the fastener 30. As a result, the push end portion 2101 of the push part 210 pushes the fastener 30 away from the engagement portion 120 of the mount 10' (e.g., in the direction of arrow A1). As illustrated, the fixing assembly 1' is also able to fix the second casing 23 to the first casing 21 and to push the second casing 23 further outward from the first casing 21 to make part of the second casing 23 form a temporary handle for the user to pull the whole second casing 23 out of the first casing 21.

Figure 8A:
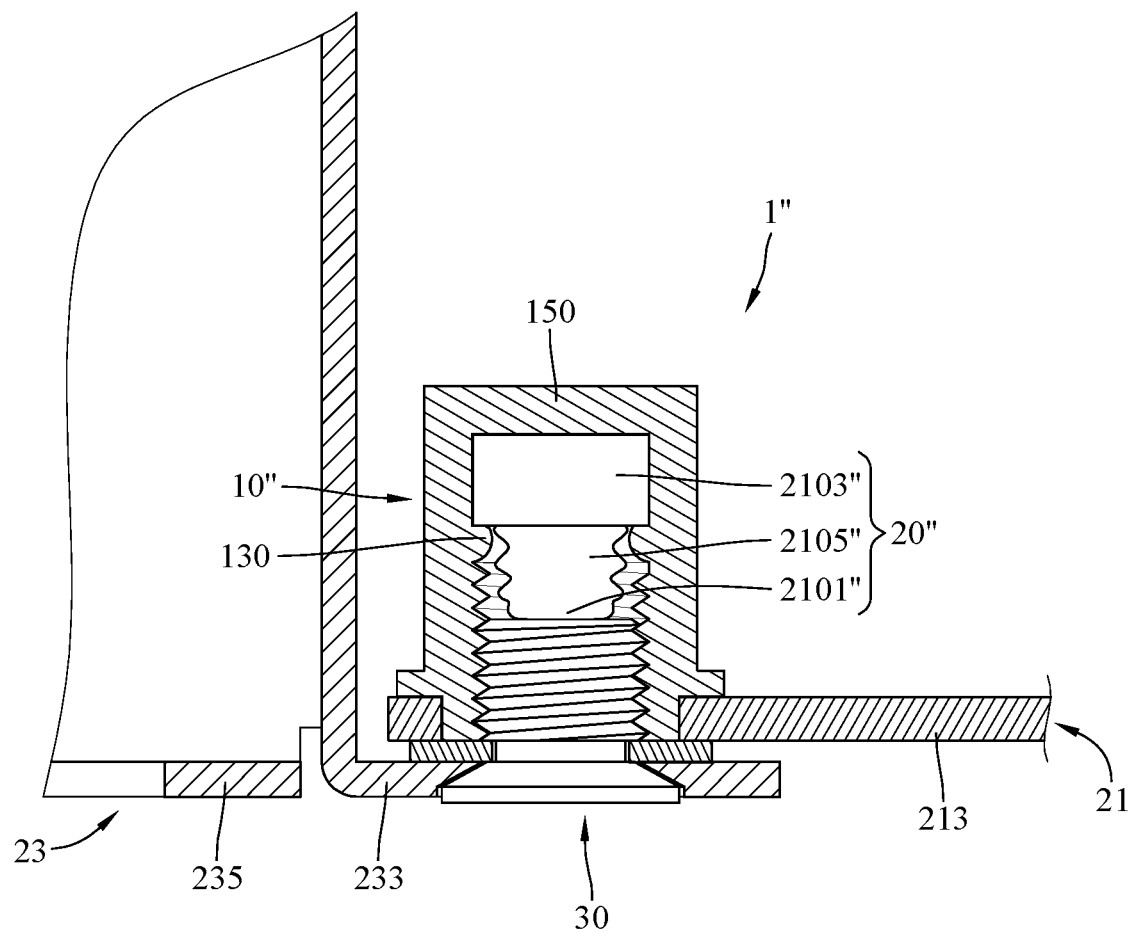
FIG. 8A is a partial enlarged cross-sectional view of a fixing assembly according to still another embodiment of the disclosure when the fixing assembly is in the assembled position.
Figure 8B:
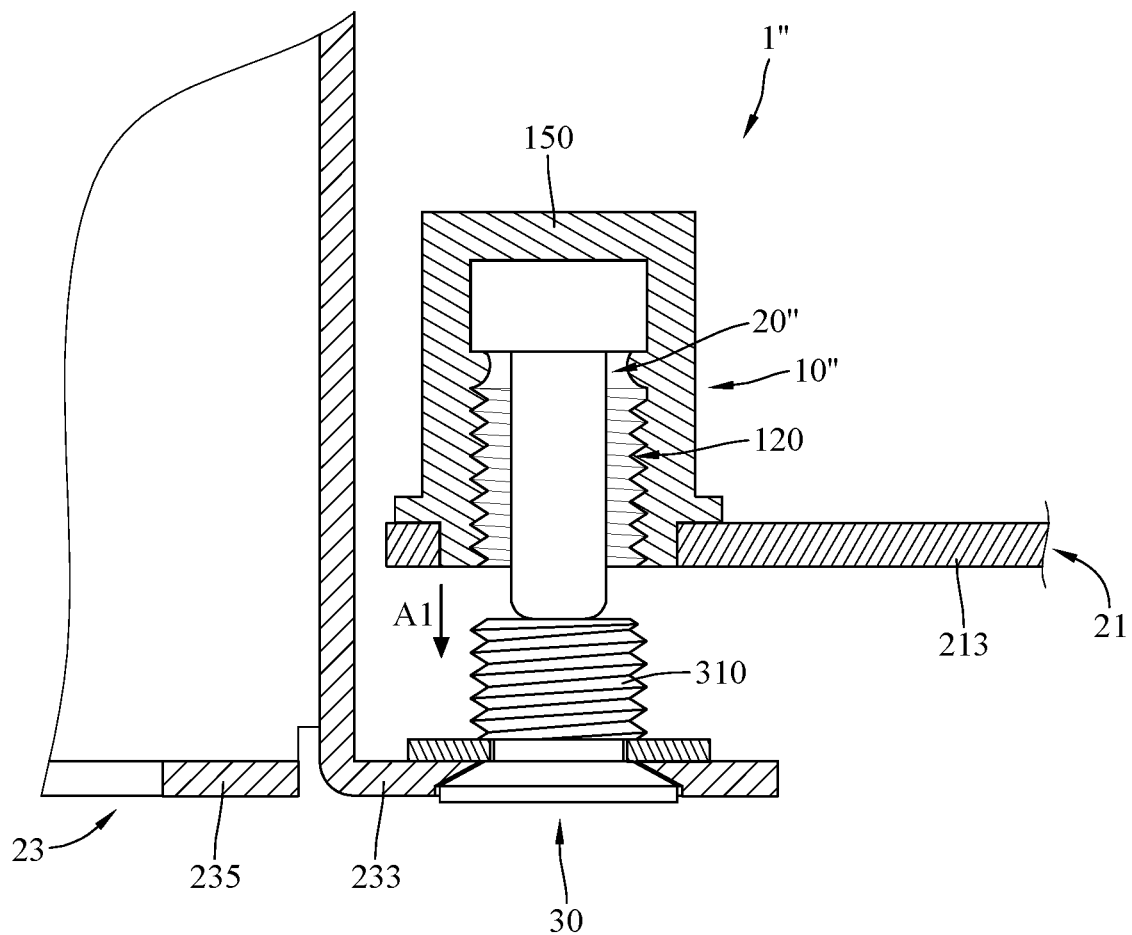
FIG. 8B is a partial enlarged cross-sectional view of the fixing assembly in FIG. 8A when the fixing assembly is in the pushing-outward position.

Alternatively, referring to FIG. 8A-8B, the disclosure provides a fixing assembly 1", FIG. 8A is a partial enlarged cross-sectional view of the assembled position of the fixing assembly 1", and FIG. 8B is a partial enlarged cross-sectional view of the pushing-outward position of the fixing assembly 1". It is noted that, for the purpose of simple illustration and clarity, the following paragraphs only describe the main differences between the fixing assembly 1" of this embodiment and the fixing assemblies in the previous embodiments, and the descriptions for the same or similar features will not be repeated hereinafter.

In this embodiment, the fixing assembly 1" includes a mount 10" and a pressure supply component 20". The pressure supply component 20" is, for example, made of a single piece that having properties, such as compressible and self-returning. For example, in one embodiment, the pressure supply component 20' is, for example, a piece of rubber. The pressure supply component 20" includes a push end portion 2101", a distal portion 2103", and an extension portion 2105", the distal portion 2103" is located between the end cover portion 150 of the mount 10" and the inner protrusion 130, and the push end portion 2101" is connected to the distal portion 2103" via the extension portion 2105". In FIG. 8A, the pressure supply component 20" is in a compressed status and stores elastic potential energy that can force the fastener 30 to move away from the mount 10".

Similarly, the fastener 30 can be rotated by a hand tool, such that the screw portion 310 of the fastener 30 is gradually disengaged from the engagement portion 120 of the mount 10". As the screw portion 310 of the fastener 30 is completely disengaged and released from the engagement portion 120 of the mount 10", the elastic potential energy stored in the pressure supply component 20" is released so that the pressure supply component 20" is allowed to return to its original shape so as to force the fastener 30 to move away from the mount 10" (e.g., in the direction of arrow A1). As illustrated, the fixing assembly 1" is also able to fix the second casing 23 to the first casing 21 and to push the second casing 23 further outward from the first casing 21 to make part of the second casing 23 form a temporary handle for the user to pull the whole second casing 23 out of the first casing 21.

Figure 9A:
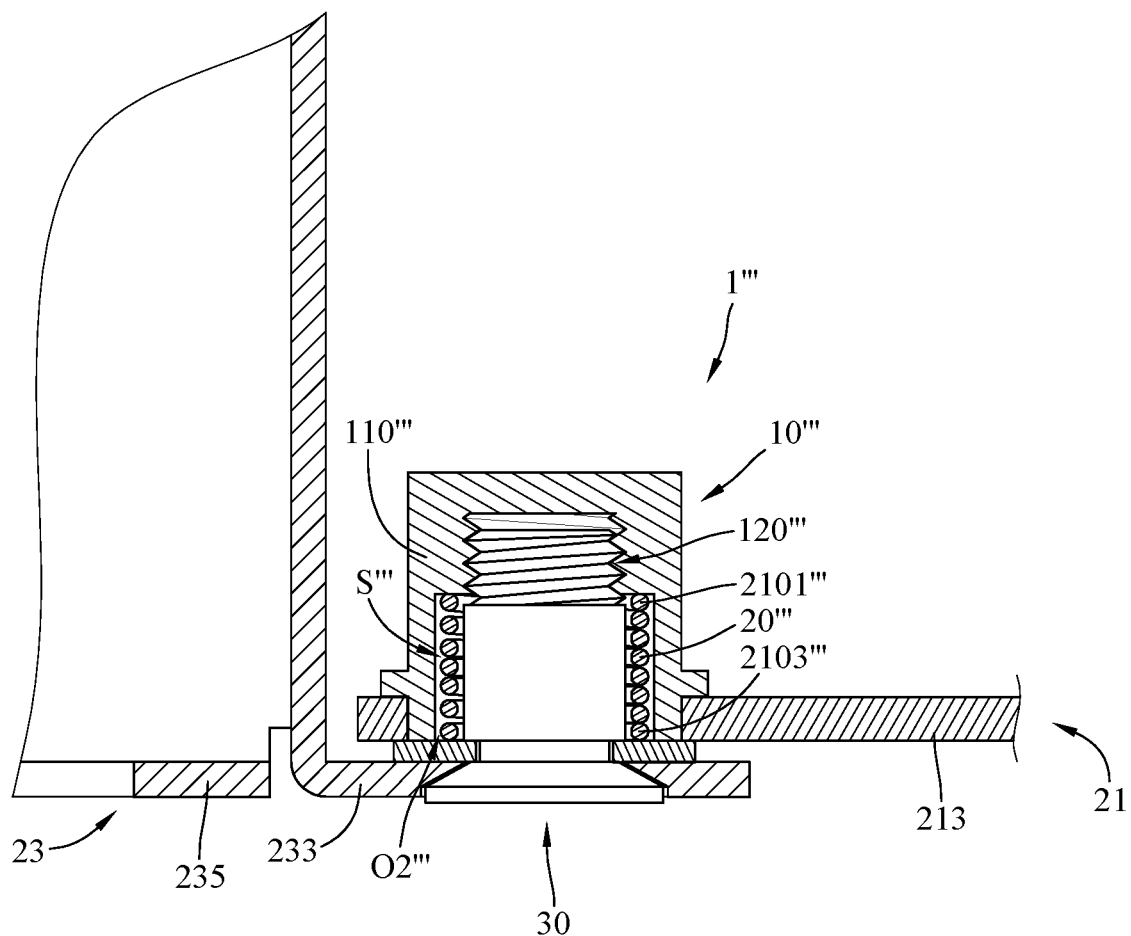
FIG. 9A is a partial enlarged cross-sectional view of a fixing assembly according to yet still another embodiment of the disclosure when the fixing assembly is in the assembled position.
Figure 9B:
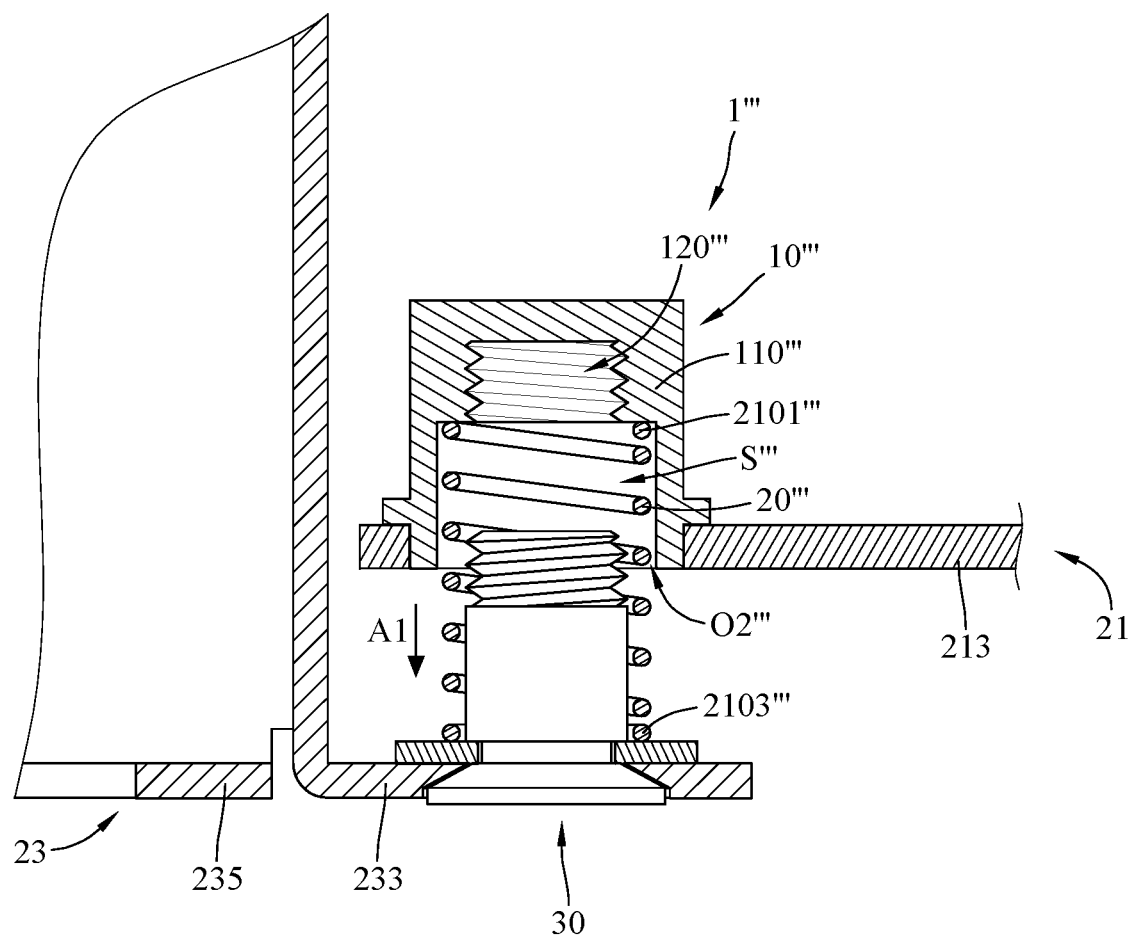
FIG. 9B is a partial enlarged cross-sectional view of the fixing assembly in FIG. 9A when the fixing assembly is in the pushing-outward position.

Alternatively, referring to FIGS. 9A-9B, the disclosure provides a fixing assembly 1''', wherein FIG. 9A is a partial enlarged cross-sectional view of the assembled position of the fixing assembly 1''', FIG. 9B is a partial enlarged cross-sectional view of the pushing-outward position of the fixing assembly 1'''. It is noted that, for the purpose of simple illustration and clarity, the following paragraphs only describe the main differences between the fixing assembly 1''' of this embodiment and the fixing assemblies in the previous embodiments, and the descriptions for the same or similar features will not be repeated hereinafter.

In this embodiment, the fixing assembly 1''' includes a mount 10''' and a pressure supply component 20'''. The mount 10''' includes a main body part 110' and an engagement portion 120''', the main body part 110''' includes an accommodation portion S''', the accommodation portion S''' has an opening O2''', the engagement portion 120''' is located on the main body part 110''' and located at a side of the accommodation portion S''' away from the opening O2'''. The pressure supply component 20''' is, for example, made of a single piece that having properties, such as compressible and self-returning. For example, in one embodiment, the pressure supply component 20''' is, for example, a compression spring. The pressure supply component 20''' includes a push end portion 2101''' and a distal portion 2103''' respectively located at two opposite ends of the pressure supply component 20'''. The distal portion 2103''' is fixed to one of the tab portion 233 of the second casing 23 and the main body part 110''' of the mount 10''', and the push end portion 2101''' is removably in contact with the other one of the tab portion 233 of the second casing 23 and the main body part 110''' of the mount 10'''. In this embodiment, the distal portion 2103''' is fixed to the tab portion 233 of the second casing 23, and in FIG. 9A, the pressure supply component 20''' is in a compressed status and stores elastic potential energy that can force the fastener 30 to move away from the mount 10'''.

Similarly, the fastener 30 can be rotated by a hand tool, such that the screw portion 310 of the fastener 30 is gradually disengaged from the engagement portion 120''' of the mount 10'''. As the screw portion 310 of the fastener 30 is completely disengaged and released from the engagement portion 120''' of the mount 10''', the elastic potential energy stored in the pressure supply component 20''' is released so that the pressure supply component 20''' is allowed to return to its original shape so as to force the fastener 30 to move away from the mount 10'''(e.g., in the direction of arrow A1). As illustrated, the fixing assembly 1''' is also able to fix the second casing 23 to the first casing 21 and to push the second casing 23 further outward from the first casing 21 to make part of the second casing 23 form a temporary handle for the user to pull the whole second casing 23 out of the first casing 21.

In addition, the disclosure is not limited to the quantity and position of the fixing assemblies of the previous embodiments. For example, in some embodiments, the first casing and the second casing of the casing assembly may have a single fixing assembly therebetween, and this fixing assembly can be arranged to suitable position according to actual requirements, such as arranged to the middle portion of the front plate of the second casing. And the related features for the installation of the fixing assembly may also be modified according to the actual position or quantity of the fixing assembly, and the disclosure is not limited thereto.

According to the fixing assembly, the casing assembly, and the electronic device having the same as discussed in the previous embodiments of the disclosure, the pressure supply component of the fixing assembly is able to apply force for forcing the mount and the fastener to move away from each other, thus, when the fastener is fixed to the mount, the pressure supply component can provide pressure on the engaged parts of the fastener and the mount so as to secure the engagement between the fastener and the mount. In the case that the fixing assembly is applied to a casing assembly having a removable casing or applied to an electronic device having a removable function module, the fixing assembly can help to firmly fix the removable casing or function module in position.

On the other hand, when the fastener is disengaged from the mount, the pressure supply component is able to push the fastener away from the mount so as to force the removable casing or function module to slide outward and thus forming a temporary handle for the user to pull out the casing or function module. Therefore, even if the space around the removable casing or function module is very limited and not sufficient for a conventional handle, the fixing assembly is still able to make part of the removable casing or function module protrude outward to become a temporary handle. Therefore, the fixing assembly facilitates the maintenance process of the removable casing or function module.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. A casing assembly, comprising:
a first casing;
a second casing, slidably disposed on the first casing; and
a fixing assembly, comprising:
a mount, disposed on the first casing;
a fastener, disposed on the second casing, wherein the fastener is detachably engaged with the mount; and
a pressure supply component, movably disposed on one of the mount and the fastener and configured to push the other one of the mount and the fastener;
wherein at least part of the pressure supply component is elastically deformable and connected to the mount and the fastener so that, when the fastener is disengaged from the mount, the fastener and the mount are sprung away from each other by the pressure supply component so as to force the second casing to protrude further outward the first casing.

2. The casing assembly according to claim 1, wherein the pressure supply component comprises a push part and an elastic part, the push part is movably disposed on the mount, the elastic part is connected to the mount and the push part so as to force the push part to move toward the fastener.

3. The casing assembly according to claim 2, wherein the mount further comprises a accommodation portion, an engagement portion located in the accommodation portion, and an inner protrusion located in the accommodation portion, the fastener is detachably engaged with the engagement portion, the push part comprises a push end portion, a distal portion, and an extension portion connected to and located between the push end portion and the distal portion, the push end portion is movably located at the engagement portion and is configured to push the fastener, the inner protrusion is located between the distal portion and the push end portion, a width of the distal portion is larger than a width of the accommodation portion at the inner protrusion, and the elastic part is clamped by the inner protrusion and the distal portion.

4. The casing assembly according to claim 3, wherein the elastic part is an extension spring.

5. The casing assembly according to claim 2, wherein the mount further comprises a accommodation portion, an engagement portion located in the accommodation portion, an inner protrusion protruding located in the accommodation portion, and an end cover portion, the fastener is detachably engaged with the engagement portion, the end cover portion is located at a side of the accommodation portion opposite to the engagement portion, the push part comprises a push end portion, a distal portion, and an extension portion connected to and located between the push end portion and the distal portion, the push end portion is movably located at the engagement portion and is configured to push the fastener, the inner protrusion is located between the distal portion and the push end portion, a width of the distal portion is larger than a width of the accommodation portion at the inner protrusion, and the elastic part is clamped by the end cover portion and the distal portion.

6. The casing assembly according to claim 5, wherein the elastic part is a compression spring.

7. The casing assembly according to claim 1, wherein the pressure supply component is made of a single piece and is clamped by the mount and the fastener.

8. The casing assembly according to claim 1, wherein the first casing comprises a first bottom plate and a first front plate, the first front plate is disposed on the first bottom plate and has an opening, the second casing comprises a second bottom plate, a second front plate, and a tab portion, the second bottom plate is slidably disposed on the first bottom plate and located at the opening, the second front plate is disposed on the second bottom plate, the tab portion is connected to the second front plate and covers at least part of the first front plate, the mount of the fixing assembly is disposed on the first front plate of the first casing, and the fastener of the fixing assembly is disposed on the tab portion of the second casing.

9. The casing assembly according to claim 8, wherein the mount has an engagement portion, the engagement portion has an internal thread, the fastener has a screw portion, the screw portion protrudes from a surface of the tab portion of the second casing facing toward the first front plate of the first casing and has an external thread, and the external thread is engagable with the internal thread.

10. A fixing assembly, comprising:
a mount;
a fastener, detachably engaged with the mount; and
a pressure supply component, movably disposed on one of the mount and the fastener and configured to push the other one of the mount and the fastener;
wherein at least part of the pressure supply component is elastically deformable and connected to the mount and the fastener so that, when the fastener is disengaged from the mount, the fastener and the mount are sprung away from each other by the pressure supply component.

11. The fixing assembly according to claim 10, wherein the pressure supply component comprises a push part and an elastic part, the push part is movably disposed on the mount, and the elastic part is connected to the mount and the push part and configured to force the push part to move toward the fastener.

12. The fixing assembly according to claim 11, wherein the mount further comprises a accommodation portion, an engagement portion located in the accommodation portion, and an inner protrusion located in the accommodation portion, the fastener is detachably engaged with the engagement portion, the push part comprises a push end portion, a distal portion, and an extension portion connected to and located between the push end portion and the distal portion, the push end portion is movably located at the engagement portion and is configured to push the fastener, the inner protrusion is located between the distal portion and the push end portion, a width of the distal portion is larger than a width of the accommodation portion at the inner protrusion, the elastic part is clamped by the inner protrusion and the distal portion.

13. The fixing assembly according to claim 12, wherein the elastic part is an extension spring.

14. The fixing assembly according to claim 11, wherein the mount further comprises a accommodation portion, an engagement portion located in the accommodation portion, an inner protrusion located in the accommodation portion, and an end cover portion, the fastener is detachably engaged with the engagement portion, the end cover portion is located at a side of the accommodation portion opposite to the engagement portion, the push part comprises a push end portion, a distal portion, and an extension portion connected to and located between the push end portion and the distal portion, the push end portion is movably located at the engagement portion and is configured to push the fastener, the inner protrusion is located between the distal portion and the push end portion, a width of the distal portion is larger than a width of the accommodation portion at the inner protrusion, and the elastic part is clamped by the end cover portion and the distal portion.

15. The fixing assembly according to claim 14, wherein the elastic part is a compression spring.

16. The fixing assembly according to claim 10, wherein the pressure supply component is made of a single piece and is clamped by the mount and the fastener.

17. An electronic device, comprising:
a first casing;
a removable function module, slidably disposed on the first casing; and
a fixing assembly, comprising:
a mount, disposed on the first casing;
a fastener, disposed on the removable function module, wherein the fastener is detachably engaged with the mount; and
a pressure supply component, movably disposed on one of the mount and the fastener and configured to push the other one of the mount and the fastener;
wherein at least part of the pressure supply component is elastically deformable and connected to the mount and the fastener so that, when the fastener is disengaged from the mount, the fastener and the mount are sprung away from each other by the pressure supply component so as to force the removable function module to protrude further outward the first casing.

18. The electronic device according to claim 17, wherein the pressure supply component comprises a push part and an elastic part, the push part is movably disposed on the mount, and the elastic part is connected to the mount and the push part and configured to force the push part to move toward the fastener.

19. The electronic device according to claim 17, wherein the first casing comprises a first bottom plate and a first front plate, the first front plate is disposed on the first bottom plate and has an opening, the removable function module comprises a second bottom plate, a second front plate, and a tab portion, the second bottom plate is slidably disposed on the first bottom plate and located at the opening, the second front plate is disposed on the second bottom plate, the tab portion is connected to the second front plate and covers at least part of the first front plate, the mount of the fixing assembly is disposed on the first front plate of the first casing, and the fastener of the fixing assembly is disposed on the tab portion of the removable function module.

20. The electronic device according to claim 19, wherein the mount has an engagement portion, the engagement portion has an internal thread, the fastener has a screw portion, the screw portion protrudes from a surface of the tab portion of the removable function module facing toward the first front plate of the first casing and has an external thread, and the external thread is engagable with the internal thread.

* * * * *